(12) United States Patent
Poechmueller

(10) Patent No.: US 7,317,248 B2
(45) Date of Patent: Jan. 8, 2008

(54) MEMORY MODULE HAVING MEMORY CHIPS PROTECTED FROM EXCESSIVE HEAT

(75) Inventor: Peter Poechmueller, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/211,893

(22) Filed: Aug. 25, 2005

(65) Prior Publication Data
US 2006/0049515 A1 Mar. 9, 2006

(30) Foreign Application Priority Data
Aug. 25, 2004 (DE) .................. 10 2004 041 027

(51) Int. Cl.
*H01L 23/34* (2006.01)
(52) U.S. Cl. .................. 257/713; 257/E23.08; 361/720; 361/721
(58) Field of Classification Search .............. 361/720, 361/719, 721; 257/713, E23.08, 712; 174/252
See application file for complete search history.

(56) References Cited

U.S. PATENT DOCUMENTS

| | | | |
|---|---|---|---|
| 6,205,028 B1 | 3/2001 | Matsumura | |
| 6,787,895 B1 * | 9/2004 | Jarcy et al. | 257/698 |
| 6,940,164 B1 * | 9/2005 | Yoshimatsu et al. | 257/725 |
| 7,031,164 B2 * | 4/2006 | Yamaguchi | 361/719 |
| 7,124,931 B2 * | 10/2006 | Lewis et al. | 228/180.22 |
| 2003/0107462 A1 * | 6/2003 | Cho | 336/198 |
| 2004/0012934 A1 * | 1/2004 | Jafari et al. | 361/760 |
| 2005/0018405 A1 * | 1/2005 | Kawano et al. | 361/719 |
| 2005/0035447 A1 * | 2/2005 | Basho et al. | 257/712 |

FOREIGN PATENT DOCUMENTS

DE    41 21 545 C2    1/1993

OTHER PUBLICATIONS

German Patent Office Examination Report dated Jun. 13, 2005.

\* cited by examiner

*Primary Examiner*—Evan Pert
*Assistant Examiner*—Victor A. Mandala, Jr.
(74) *Attorney, Agent, or Firm*—Patterson & Sheridan, L.L.P.

(57) ABSTRACT

The invention relates to a memory module having a printed circuit board; having one or more memory chips which are arranged in a first region of the printed circuit board and are contact-connected by the printed circuit board; having a buffer chip for driving the memory chips and for communicating with a system that is external to the memory module, the buffer chip being arranged in a second region of the printed circuit board and being contact-connected by the printed circuit board; wherein the first and second regions of the printed circuit board are essentially thermally decoupled from one another.

21 Claims, 3 Drawing Sheets

MEMORY MODULE HAVING MEMORY CHIPS PROTECTED FROM EXCESSIVE HEAT

CROSS-REFERENCE TO RELATED APPLICATIONS

This application claims foreign priority benefits under 35 U.S.C. §119 to co-pending German patent application number DE 10 2004 041 027.5, filed 25 Aug. 2004. This related patent application is herein incorporated by reference in its entirety.

BACKGROUND OF THE INVENTION

1. Field of the Invention

The invention relates to a memory module, one or more memory chips being applied to a printed circuit board and the printed circuit board being connected to an overall system.

2. Description of the Related Art

Novel memory modules usually have a printed circuit board to which memory chips are applied, the latter being connected, via rewiring lines on the printed circuit board, to a buffer chip which is likewise applied to the printed circuit board. In this case, the buffer chip is used to provide a very fast point-to-point connection to an external memory controller. That is to say, the buffer chip establishes a very fast serial data connection to an overall system. The buffer chip parallelizes data to be written to the memory chips and serializes the data to be read from the memory chips. This means that communication on the printed circuit board of the memory module takes place at a lower clock speed than communication between the memory module and the overall system.

Due to this operation, in particular due to the high transmission frequency of the buffer chips to the overall system, the buffer chip has very high power consumption. This high power consumption results in the buffer chip being severely heated during operation. The generation of heat in the buffer chip also affects, via the heat conduction of the printed circuit board, the memory chips applied to the printed circuit board since increased temperatures of the memory chips lead to increased leakage currents in the memory cells and the demands imposed on the data retention time of the memories are thus adversely affected.

Apart from various attempts at reducing the power consumption of the buffer chip, no measures for protecting the memory chips from increased evolution of heat in the buffer chip have hitherto been disclosed.

SUMMARY OF THE INVENTION

Therefore, one embodiment of the present invention to provide a memory module on which the memory chips are protected from excessive heating.

A memory module having a printed circuit board is provided according to one embodiment of the invention. Arranged on the printed circuit board are one or more memory chips which are arranged in a first region of the printed circuit board and are contact-connected by the printed circuit board. A buffer chip is also provided for driving the memory chips and for communicating with a system that is external to the memory module. The buffer chip is arranged in a second region of the printed circuit board and is contact-connected by the printed circuit board. The first and second regions of the printed circuit board are essentially thermally decoupled from one another.

The memory module according to embodiments of the invention may have the advantage that a buffer chip which is arranged on the memory chip and usually has a very high power consumption and, as a result of this, very high evolution of heat is thermally decoupled from the memory chips, with the result that heating of the memory chips on account of the proximity to the buffer chip is reduced or avoided. This may increase the lifetime of the memory chips and reduce the negative effects on the data retention time of the memory cells on account of increased leakage currents.

In another embodiment of the invention, the printed circuit board has an intermediate region which is arranged between the first and second regions and has a lower thermal conductivity than the first region and the second region of the printed circuit board. This constitutes a simple means of thermally decoupling the first region having the buffer chip and the second region having the memory chips.

The intermediate region of the printed circuit board may contain with one or more passages, with the result that the first region and the second region are connected to one another by means of webs of the printed circuit board, said webs having a reduced cross sectional area in order to increase the thermal resistance in this manner.

The intermediate region of the printed circuit board may contain with one or more passages in order to reduce the thermal conductivity of the intermediate region. It is advantageous, in particular, if the inner walls of the passages are uncoated, i.e. are not provided with a metalization layer.

However, a cooling element may also be fastened in the one or more passages in order to dissipate the heat between the first and second regions. The cooling element may, in particular, be soldered in order to use the soldered connection to establish the best possible thermal conductivity between the cooling element and the intermediate region.

The cooling element may, in particular, be in thermal contact with a further printed circuit board, for example a printed circuit board of the system that is external to the memory module, in order to dissipate heat. This enables the best possible thermal equalization between the printed circuit boards of the overall system, in particular in order to reduce thermally induced mechanical stresses.

In another embodiment of the invention, the printed circuit board may have a supply conductor surface to which a supply potential can be applied, the supply conductor surface being interrupted by cutouts in an intermediate region between the first and second regions of the printed circuit board. This reduces the cross-sectional area of the connecting regions for the electrical connection between the relevant section of the supply conductor surface in the first region and the corresponding section of the supply conductor surface in the second region, with the result that the thermal conductivity (which is usually high overall) of a metalization layer is compensated for by the reduction in the cross-sectional area, thus reducing the thermal conductivity which is largely caused by the supply conductor surface.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not

DETAILED DESCRIPTION OF THE PREFERRED EMBODIMENT

Figure 1:
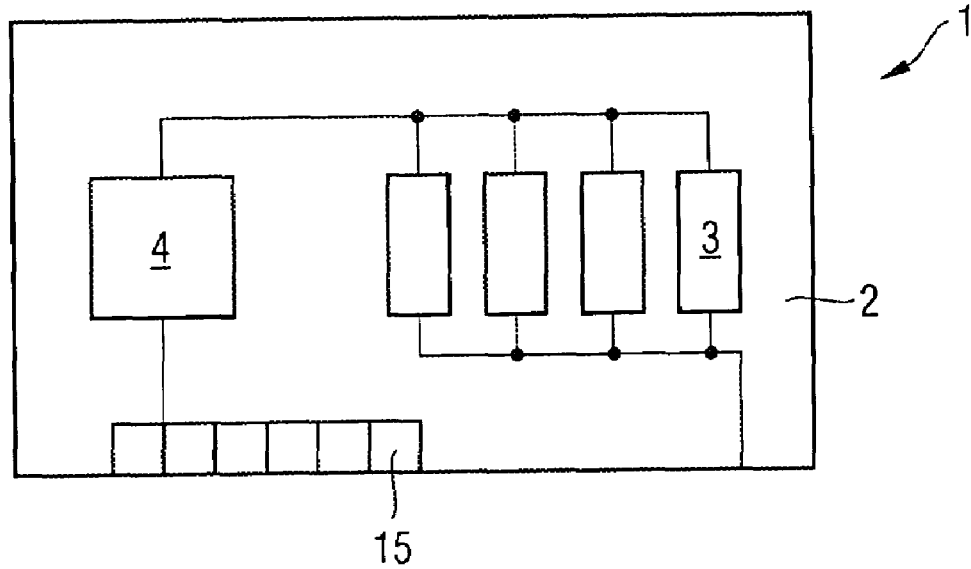
FIG. 1 shows a conventional memory module having a buffer chip and a plurality of memory chips in accordance with the prior art.

FIG. 1 shows a memory module 1 having a printed circuit board 2 on which a plurality of memory chips 3 and a buffer chip 4 are arranged. Arranged on the printed circuit board 2 are conductor tracks (not shown in detail) which connect the memory chips 3 to the buffer chip 4 and to an interface (which is applied to the printed circuit board 2 and is in the form of a plug connection 15) in a suitable manner in order to form the memory module 1 which can be driven by an external system. The memory module 1 is predominantly used to receive data from the external system, to store said data in the memory chips 3, to read out data from the memory chips 3 and to provide the external system with said data.

Instead of the plug connector 15, it is also possible to provide any other type of connection contacts which can be used to permanently connect the printed circuit board 2 to the external system.

Figure 2:
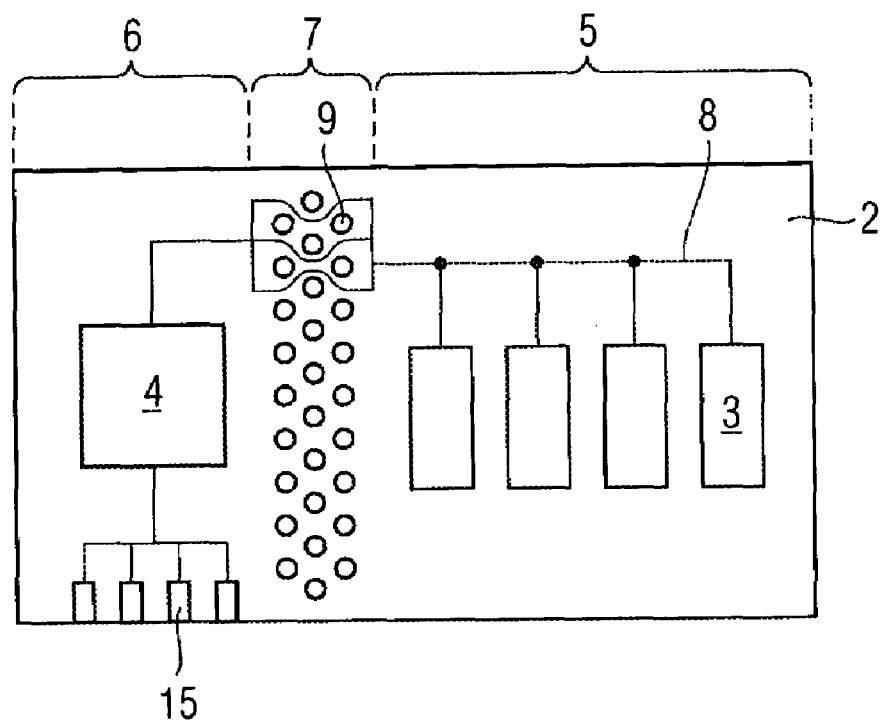
FIG. 2 shows a memory module according to the invention in accordance with a first embodiment of the invention.

The buffer chip 4 is used to provide a fast high-frequency data transmission path to the external system via the plug connection 15, to suitably parallelize the data which are received from the external system and are to be stored in the memory chips 3 and to provide the memory chips 3 with said data at a reduced clock frequency. FIG. 2 illustrates a memory module 1 in accordance with a first embodiment of the present invention. In the text below, identical reference symbols relate to identical elements or elements having the same function. For the memory module 1 of FIG. 2, the memory chips 3 are arranged in a first region of the printed circuit board 2 and the buffer chip 4 is arranged in a second region 6 of the printed circuit board 2. The printed circuit board 2 is illustrated as being essentially rectangular but it may also have any other desired shape. Provided between the first region 5 and the second region 6 of the printed circuit board 2 is an intermediate region 7 which is used to thermally decouple the first region 5 and the second region 6. The intermediate region 7 has a number of passage holes 9 in order to reduce the thermal conductivity between the first region and the second region 6. The passage holes reduce the cross-sectional area which is used to connect the first region to the second region, with the result that, given the same specific thermal conductivity of the printed circuit board 2, a higher thermal resistance is achieved.

In contrast to other plated-through holes provided on the printed circuit board 2, the passage holes 9 are may not be metalized, with the result that the heat conduction between the first and second regions is not unnecessarily increased thereby. Conductor tracks 8 which are illustrated, by way of example, as connections between the buffer chip 4 and the memory chips 3 are routed around the passage holes 9 on the remaining webs. In one possible arrangement of the passage holes 9, the holes are arranged in a plurality of rows between the first and second regions 5, 6 in such a manner that they are offset with respect to one another. The diameter of the passage holes 9 and the distances between the passage holes 9 may be selected in such a manner that the mechanical stability of the printed circuit board is not impaired or is not considerably impaired.

In accordance with the embodiment of FIG. 2, it is advantageous if at least 20% of the area of the intermediate region is occupied by the passage holes 9. The passage holes 9 can be introduced using methods which are known to a person skilled in the art, such as boring, laser boring, depth etching or similar methods.

The intermediate region 7 between the regions (which are thermally decoupled from one another) of the supply conductor surface 13 is configured in such a manner that the cross-sectional area of the supply conductor surface between the first and second regions 5, 6 may be reduced by 50% or more in order to achieve considerable thermal decoupling.

Figure 3:
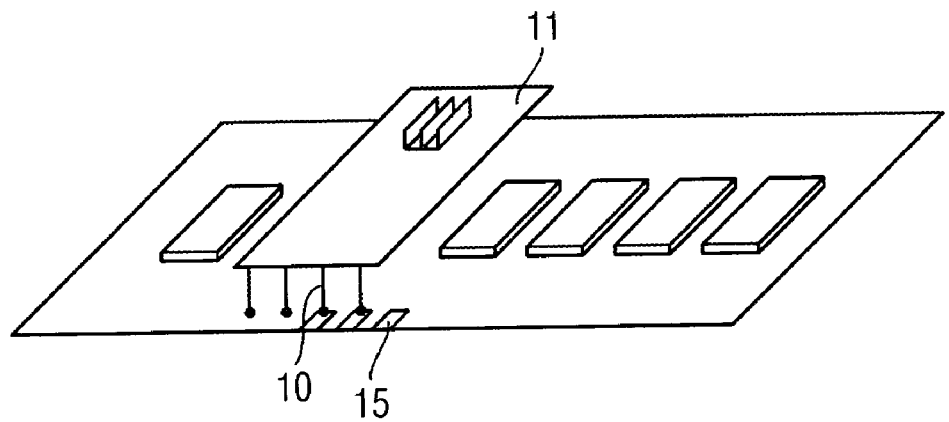
FIG. 3 shows a memory module having a cooling element in accordance with another embodiment of the present invention.

FIG. 3 illustrates another printed circuit board 2 according to one embodiment of the invention. As depicted, holding elements 10 for a cooling element 11 are introduced into the passage holes 9, said cooling element absorbing the heat transmitted in the intermediate region 7 in order to discharge it to the surrounding area. Alternatively, the cooling element 11 may be connected to another heat sink, for example a printed circuit board of the external system, a housing or another element, in order to dissipate heat.

The cooling element may also be provided with a cooling-air fan or the like in order to achieve even better heat dissipation to the surrounding area.

Figure 4:
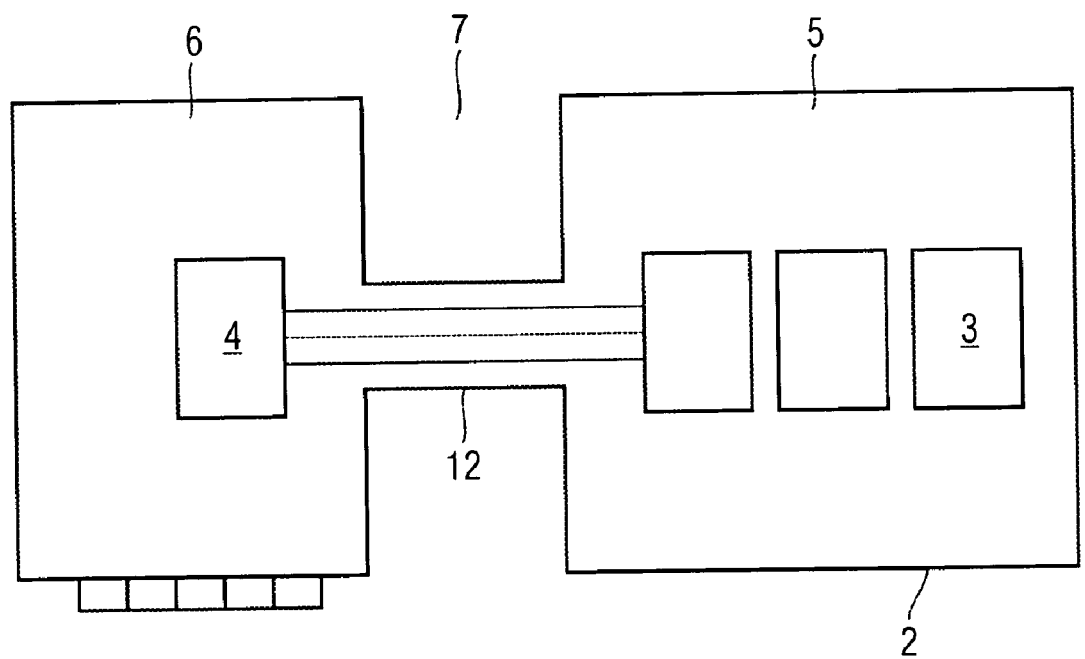
FIG. 4 shows a memory module having a web in accordance with another embodiment of the present invention.

FIG. 4 illustrates another embodiment of the present invention. As depicted, the first region 5 and the second region 6 are connected to one another by means of a narrow web 12 of the printed circuit board 2. The narrow web 12 is formed in the intermediate region 7 of the printed circuit board 2. A plurality of webs 12 may also be provided. In the intermediate region 7, cutouts extend from opposite edges of the printed circuit board 2 up to the web 12 which has a width that is sufficient to ensure the mechanical stability of the memory module 1 and which has a surface area that is sufficient to accommodate the connecting conductor tracks between the memory chips 3 and the buffer chip 4. The position of the web 12 with respect to the first and second regions 5, 6 can essentially be freely selected but a central arrangement of the web with respect to the width of the memory module is advantageous in order to minimize torsion moments which may act on the web.

Figure 5:
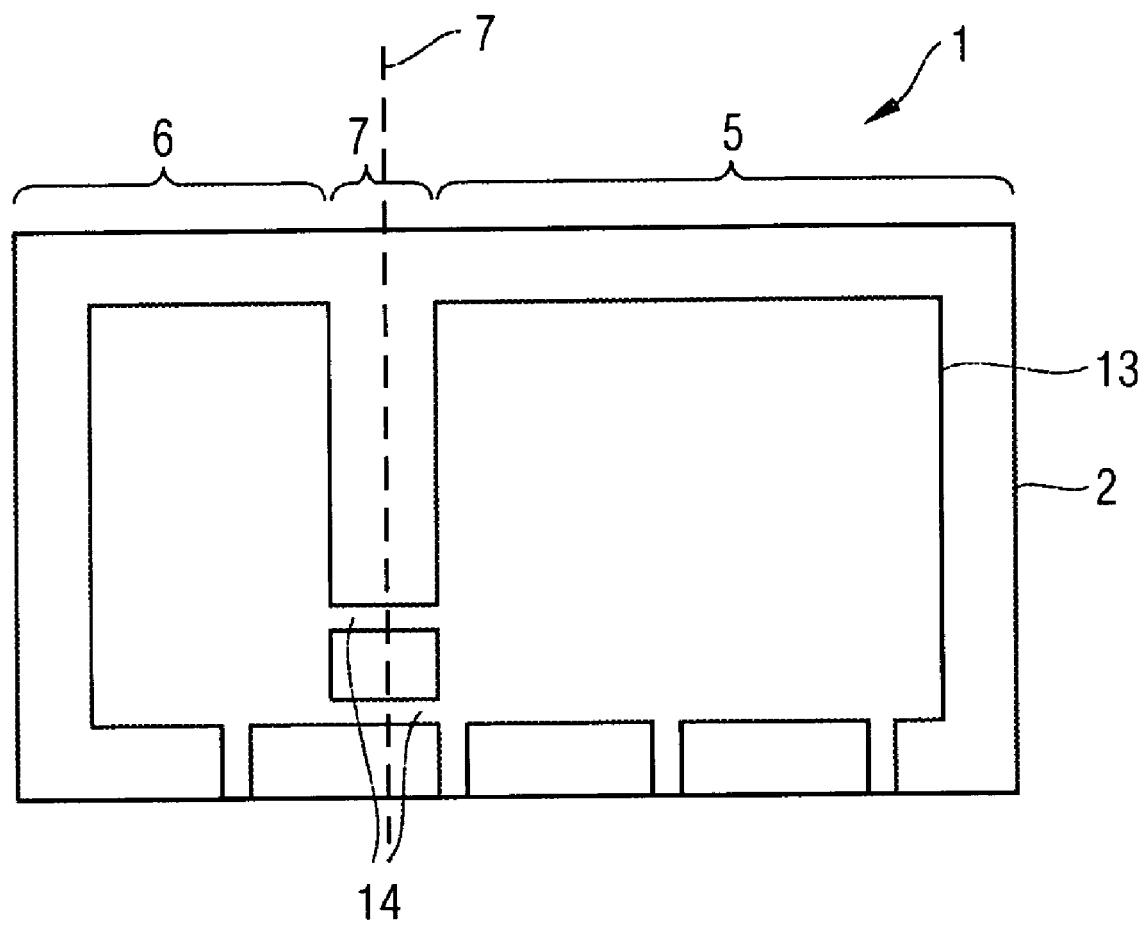
FIG. 5 shows a view of a printed circuit board for a memory module, in which the supply conductor surfaces of the first and second regions are thermally decoupled from one another.

FIG. 5 illustrates another embodiment of the invention. As depicted, the printed circuit board 2 of the memory module 1 has a supply conductor surface 13 which is provided either on a surface of the printed circuit board or in an intermediate layer of the printed circuit board 2. The supply conductor surface 13 is used to provide a supply voltage with as little electrical resistance as possible at any location of the printed circuit board 2 at which the supply voltage is required by a chip that has been applied to said printed circuit board. In order to ensure contact connections to the chips 3, 4, said contact connections being insulated from the supply conductor surface 13, and to route conductor tracks in a manner such that they are insulated from the supply conductor surface, the cutouts may be provided in the supply conductor surface 13 in order to insulate the contacts and the conductor track electrically from the supply conductor surface, or the contacts and conductor tracks are provided in another conductor track plane of the printed circuit board 2.

According to one embodiment, unlike the previous unitary design of the supply conductor surface, the latter is of two-part design in the embodiment of FIG. 5. A first part of the supply conductor surface is arranged in the first region 5 and a second part of the supply conductor surface is arranged in the second region 6 of the printed circuit board 2. The supply conductor surfaces 13 are connected to one another via conductive connecting webs 14 which are sufficiently large to provide the lowest possible electrical resistance but have a high thermal resistance. They may be implemented, for example, by means of webs between the first and second regions 5, 6 of the supply conductor surface. In particular, the thermal decoupling of the supply conductor surfaces in the two regions 5, 6 of the printed circuit board 2 leads to considerable thermal decoupling of the first and second regions 5, 6 as compared to supply conductor surfaces which are configured, in a flat manner, from a metal layer that is very highly thermally conductive.

While the foregoing is directed to embodiments of the present invention, other and further embodiments of the invention may be devised without departing from the basic scope thereof, and the scope thereof is determined by the claims that follow.

What is claimed is:

1. An apparatus, comprising
   a printed circuit board;
   one or more memory chips which are arranged in a first region of the printed circuit board and are connected with the printed circuit board;
   a buffer chip configured to drive the one or more memory chips and communicate with a system that is external to the apparatus, wherein the buffer chip is arranged in a second region of the printed circuit board and wherein the buffer chip is connected to the printed circuit board; and
   an intermediate region located between the first region and the second region, wherein:
   the intermediate region has a lower thermal conductivity than the first and second regions of the printed circuit board; and
   the intermediate region comprises:
     a plurality of unplated holes;
     a plurality of webs connecting the first region with the second region, located between the plurality of unplated holes, such that conductor tracks on the plurality of webs connect the buffer chip with at least one of the one or more memory chips.

2. The apparatus of claim 1, wherein the intermediate region of the printed circuit board is provided with one or more passages, wherein inner walls of the passages are uncoated.

3. The memory module of claim 2, wherein a cooling element is fastened in the one or more passages to dissipate heat.

4. The memory module of claim 1, wherein the printed circuit board comprises:
   a supply conductor surface to which a supply potential is applied, wherein the supply conductor surface comprises cutouts in the intermediate region between the first and second regions of the printed circuit board.

5. The memory module of claim 4, wherein the cooling element is in thermal contact with another printed circuit board to dissipate heat.

6. The memory module of claim 5, wherein the cooling element is soldered in the passages.

7. The apparatus of claim 1 wherein the plurality of unplated holes comprise at least 20% of the surface area of the intermediate region.

8. An apparatus, comprising:
   a printed circuit board having a first region and a second region, wherein a plurality of unplated holes are formed in an intermediate region between the first region and the second region, wherein the plurality of unplated holes are positioned and configured to reduce thermal conduction between the first region and the second region, and the plurality of unplated holes comprise at least 20% of the surface area of the intermediate region;
   a buffer chip attached in the first region of the printed circuit board;
   a plurality of memory chips attached in the second region of the printed circuit board; and
   one or more conductive lines connecting the buffer chip to the plurality of memory chips, wherein the conductive lines are routed between the plurality of unplated holes.

9. The memory device of claim 8, further comprising:
   a cooling device soldered in the plurality of unplated holes.

10. The memory device of claim 9, further comprising:
    a fan attached to the cooling device and configured to cool the cooling device.

11. An apparatus comprising:
    a printed circuit board having a first region and a second region, wherein a plurality of unplated holes are formed in an intermediate region between the first region and the second region, wherein the plurality of unplated holes in the intermediate region are:
      positioned and configured to reduce thermal conduction between the first region and the second region; and
      arranged in a plurality of columns, wherein each column contains a corresponding plurality of unplated holes arranged vertically in the intermediate region;
    a buffer chip attached in the first region of the printed circuit board;
    a plurality of memory chips attached in the second region of the printed circuit board; and
    one or more conductive lines connecting the buffer chip to the plurality of memory chips, wherein the conductive lines are routed between the plurality of unplated holes.

12. The memory device of claim 11, wherein each column of the plurality of columns is offset with respect to each adjacent column.

13. An apparatus, comprising:
    means for supporting having a first region and a second region, wherein a plurality of unplated holes are formed in an intermediate region between the first region and the second region to reduce thermal conduction between the first region and the second region, wherein the plurality of holes in the intermediate region are arranged in a plurality of columns, wherein each column contains a corresponding plurality of unplated holes arranged vertically in the intermediate region;
    means for buffering attached in the first region;
    means for storing attached in the second region; and
    means for conducting connecting the means for buffering to the means for storing, wherein the conductive lines are routed between the plurality of unplated holes.

14. The memory device of claim 13, wherein each column of the plurality of columns is offset with respect to each adjacent column.

15. The memory device of claim 13, further comprising:
means for cooling soldered in the plurality of unplated holes.

16. A method for forming an apparatus comprising:
arranging one or more memory chips in a first region of a printed circuit board, wherein the one or more memory chips are connected with the printed circuit board;
arranging a buffer chip in a second region of the printed circuit board, wherein the buffer chip is connected to the printed circuit board and wherein the buffer chip configured to drive the one or more memory chips and communicate with a system that is external to the apparatus; and
providing an intermediate region between the first region and the second region, wherein the intermediate region has a lower thermal conductivity than the first and second regions of the printed circuit board; and
the intermediate region comprises:
 a plurality of unplated holes;
 a plurality of webs connecting the first region with the second region, located between the plurality of unplated holes, such that conductor tracks on the plurality of webs connect the buffer chip with at least one of the one or more memory chips.

17. The method of claim 16, further comprising:
forming the plurality of unplated holes in the intermediate region between the first region and the second region, thereby reducing thermal conductivity between the first region and the second region, wherein one or more conductive lines connecting the buffer chip to the one or more memory chips are routed between the plurality of unplated holes in the intermediate region.

18. The method of claim 17, further comprising:
soldering a cooling device in the plurality of unplated holes.

19. The method of claim 18, further comprising:
attaching the cooling device to a second printed circuit board.

20. The method of claim 17, wherein the plurality of unplated holes are formed by one of mechanical boring, laser boring, and depth etching.

21. A method for forming an apparatus, comprising:
arranging one or more memory chips in a first region of a printed circuit board, wherein the one or more memory chips are connected with the printed circuit board;
arranging a buffer chip in a second region of the printed circuit board, wherein the buffer chip is connected to the printed circuit board and wherein the buffer chip configured to drive the one or more memory chips and communicate with a system that is external to the apparatus;
providing an intermediate region between the first region and the second region, wherein the intermediate region has a lower thermal conductivity than the first and second regions of the printed circuit board; and
forming a plurality of unplated holes in the intermediate region between the first region and the second region, thereby reducing thermal conductivity between the first region and the second region, wherein one or more conductive lines connecting the buffer chip to the one or more memory chips are routed between the plurality of unplated holes in the intermediate region, wherein the plurality of unplated holes are:
 formed by one of mechanical boring, laser boring, and depth etching; and
 arranged in a plurality of columns, wherein each column contains a corresponding plurality of unplated holes arranged vertically in the intermediate region, and wherein each column of the plurality of columns is offset with respect to each adjacent column, thereby forming a honey-combed pattern.

* * * * *